United States Patent [19]

Inoue

[11] 4,190,855

[45] Feb. 26, 1980

[54] INSTALLATION OF A SEMICONDUCTOR CHIP ON A GLASS SUBSTRATE

[75] Inventor: Yukihiro Inoue, Kashihara, Japan

[73] Assignee: Sharp Kabushiki Kaisha, Osaka, Japan

[21] Appl. No.: 823,455

[22] Filed: Aug. 10, 1977

[30] Foreign Application Priority Data

Aug. 11, 1976 [JP] Japan ................................ 51/96365

[51] Int. Cl.² ........................................... H01L 39/02
[52] U.S. Cl. ...................................... 357/80; 357/55; 357/72; 357/73
[58] Field of Search ..................... 357/72, 55, 73, 80

[56] References Cited

U.S. PATENT DOCUMENTS

| | | | |
|---|---|---|---|
| 3,653,959 | 4/1972 | Kehr | 357/72 |
| 3,691,628 | 9/1972 | Kim et al. | 357/72 |
| 4,001,871 | 1/1977 | Tsunemitsu | 357/73 |

Primary Examiner—Edward J. Wojciechowicz
Attorney, Agent, or Firm—Birch, Stewart, Kolasch & Birch

[57] ABSTRACT

A flipchip LSI is mounted on a glass substrate through the use of bonding techniques. An insulating layer made of, for example, epoxy resin is formed between the LSI chip and the glass substrate in such a manner that the insulating layer is fixed to both of the LSI chip and the glass substrate. The insulating layer functions to absorb strain caused by differences of the coefficient of thermal expansion of the LSI chip and the glass substrate, thereby securing stable operation of the LSI chip.

7 Claims, 1 Drawing Figure

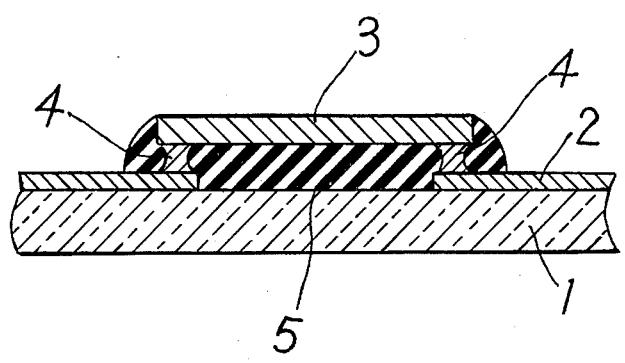

INSTALLATION OF A SEMICONDUCTOR CHIP ON A GLASS SUBSTRATE

BACKGROUND AND SUMMARY OF THE INVENTION

The present invention relates to installation of a semiconductor chip on a substrate.

The present invention relates, more particularly, to installation of a semiconductor chip on a glass substrate, which can minimize strain caused by differences of the coefficient of thermal expansion of the semiconductor chip and the glass substrate.

In the conventional system, a semiconductor chip is mounted on a substrate made of ceramics through the use of bonding techniques. The ceramic substrate is very strong and the ceramic substrate has the coefficient of thermal expansion similar to that of the semiconductor chip. Therefore, there is little possibility that a crack is created in the substrate or the semiconductor chip is damaged due to strain created between the semiconductor chip and the ceramic substrate.

Recently, a glass substrate has been frequently employed, because the glass substrate is very effective for providing an electronic apparatus mounted on a single substrate in case where the electronic apparatus has a liquid crystal display means.

However, the glass substrate is not so strong as the ceramic substrate. And the glass substrate has the coefficient of thermal expansion considerably larger than that of the semiconductor chip. More specifically, the coefficient of thermal expansion of the glass substrate is $80-100 \times 10^{-7}/°C.$, whereas the coefficient of the thermal expansion of the semiconductor chip is about $30-10^{-7}/°C$. Such differences of the coefficient of thermal expansion will create cracks in the glass substrate or will damage the semiconductor chip when the apparatus is used at different temperature conditions.

Accordingly, an object of the present invention is to provide a novel installation construction of a semiconductor chip on a substrate.

Another object of the present invention is to minimize undesirable strain created between a semiconductor chip and a glass substrate for supporting the semiconductor chip.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, an insulating layer made of, for example, epoxy resin, silicone resin or photo-curing acryl resin is formed between the semiconductor chip and the glass substrate in such a manner that the insulating layer is fixed to both of the semiconductor chip and the glass substrate.

The insulating layer functions to absorb strain caused by differences of the coefficient of thermal expansion of the semiconductor chip and the glass substrate.

BRIEF DESCRIPTION OF THE DRAWING

The present invention will become more fully understood from the detailed description given hereinbelow and the accompanying drawing which is given by way of illustration only, and thus is not limitative of the present invention and wherein, The single FIGURE of the drawing is a sectional view of an embodiment of an installation construction of a semiconductor chip on a glass substrate of the present invention.

DESCRIPTION OF THE PREFERRED EMBODIMENTS

Wiring patterns 2 are formed on a glass substrate 1 in a desired configuration. A flipchip LSI 3 is mounted on the glass substrate 1 via solder 4 through the use of bonding techniques. Needless to say, the flipchip LSI is electrically connected to the wiring patterns 2 through the solder 4.

Thereafter, an insulating layer 5 is formed between the glass substrate 1 and the flipchip LSI 3 in such a manner that the insulating layer 5 is fixed to both of the glass substrate 1 and the flipchip LSI 3. The insulating layer 5 is made of, for example, epoxy resin, silicone resin or photo curing acryl resin, namely, photobond.

The insulating layer 5 functions to absorb strain caused by differences of the coefficient of thermal expansion of the flipchip LSI 3 and the glass substrate 1. By providing the insulating layer 5 between the glass substrate 1 and the flipchip LSI 3, cracks will not be created in the glass substrate 1 and the flipchip LSI 3 will not be damaged even when the device is positioned in different temperature conditions.

In a typical example, after the flipchip LSI 3 is mounted on the glass substrate 1, epoxy resin such as SCOTCH CAST 281 is filled between the flipchip LSI 3 and the glass substrate 1 through the use of a potting method. And the device is maintained at 100° C. for five hours in order to fix the resin. The insulating layer 5 is tightly attached to both of the glass substrate 1 and the flipchip LSI 3.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A semiconductor device comprising:
   (a) a flipchip integrated circuit device having a specific coefficient of thermal expansion;
   (b) a mechanical supporting substrate which has a coefficient of thermal expansion substantially different from that of said flipchip and bears a low mechanical resistance against thermal expansion;
   (c) a wiring pattern deposited on said supporting substrate;
   (d) a bonding member for bounding said flipchip integrated circuit device and said substrate, said flipchip integrated circuit device being mechanically supported by the bonding member; and
   (e) an insulating resin layer deposited in such a manner so as to cover at least a junction between said flipchip integrated circuit device and said bonding member and a junction between said substrate and said bonding member, said insulating resin layer having a coefficient of thermal expansion sufficient to absorb mechanical strain caused by the differences in the coefficient of thermal expansion between said flipchip integrated circuit and said substrate, thereby ensuring the mechanical tightness of the junctions between said flipchip integrated circuit device and said bonding member and between said substrate and said bonding member against a substantial amount of thermal expansion.

2. The semiconductor device of claim 1 wherein said supporting substrate has a coefficient of thermal expansion of about 80 to $100 \times 10^{-7}/°C$. and said flipchip integrated circuit has a coefficient of thermal expansion of about $30 \times 10^{-7}/°C$.

3. The semiconductor device of claim 1 wherein the substrate is a glass substrate, and the insulating layer is a resin selected from the group consisting of an epoxy resin, a silicone resin and a photocuring acryl resin.

4. The semiconductor device of claim 1, wherein said substrate is a glass substrate.

5. The semiconductor device of claim 1, wherein said resin is epoxy resin.

6. The semiconductor device of claim 1, wherein said resin is photo curing acryl resin.

7. The semiconductor device of claim 1, wherein said resin is silicone resin.

* * * * *